(12) United States Patent
Ma

(10) Patent No.: US 6,560,113 B1
(45) Date of Patent: May 6, 2003

(54) ELECTRONIC DEVICE ASSEMBLY HAVING THERMAL MODULE FOR HEAT DISSIPATION

(75) Inventor: Hao-Yuan Ma, Tu-Chen (TW)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 10/121,548

(22) Filed: Apr. 12, 2002

(30) Foreign Application Priority Data

Jan. 30, 2002 (TW) ...................................... 91200993 U

(51) Int. Cl.[7] .................................................. H05K 7/20
(52) U.S. Cl. ...................... 361/719; 361/704; 257/718; 24/457; 248/505
(58) Field of Search .............................. 361/704, 707, 361/709–712, 717–719, 722; 174/16.3; 165/80.3, 185; 257/706, 718, 727; 248/505, 510

(56) References Cited

U.S. PATENT DOCUMENTS

| | | | | |
|---|---|---|---|---|
| 5,847,928 A | * | 12/1998 | Hinshaw et al. ............ | 361/704 |
| 5,883,782 A | * | 3/1999 | Thurston et al. ............ | 361/704 |
| 5,883,783 A | * | 3/1999 | Turturro ...................... | 361/704 |
| 6,055,159 A | * | 4/2000 | Sun .............................. | 361/704 |
| 6,125,037 A | * | 9/2000 | Bollesen ...................... | 361/704 |
| 6,154,365 A | * | 11/2000 | Pollard et al. ............... | 361/704 |
| 6,307,747 B1 | * | 10/2001 | Farnsworth et al. ........ | 361/704 |
| 6,381,136 B1 | * | 4/2002 | Nelson et al. ............... | 361/704 |

* cited by examiner

Primary Examiner—Boris Chervinsky
(74) Attorney, Agent, or Firm—Wei Te Chung

(57) ABSTRACT

An electronic device assembly includes a PCB (20), a socket (26) mounted on the PCB, a CPU (22) connected with the socket, a thermal module (30) in thermal contact with the CPU, and a back plate (10) attached to an underside of the PCB opposite the CPU. The back plate includes a pair of recessed portions (14), and a protruding portion (12) between the recessed portions. The protruding portion is configured to abut against the PCB and thereby prevent deformation of the PCB. A plurality of bolts (50) extends through the recessed portions of the back plate, the PCB and the thermal module, and respectively threadedly engages with a plurality of nuts (40). The electronic device assembly is thereby fixed together.

18 Claims, 5 Drawing Sheets

ELECTRONIC DEVICE ASSEMBLY HAVING THERMAL MODULE FOR HEAT DISSIPATION

BACKGROUND OF THE INVENTION

1. Field of the Invention

The present invention relates to electronic device assemblies, and particularly to an electronic device assembly having a thermal module for heat dissipation, a printed circuit board (PCB) and a back plate for protecting the PCB.

2. Related Art

Developments in computer chip technology have given computers central processing units (CPUs) with more functions and faster processing speeds. Accordingly, modern CPUs generate copious amounts of heat. Excessive heat can adversely affect operation of the computer system, and cause the system to become unstable. Therefore, a thermal module is widely used to remove heat from a CPU of a computer.

Referring to FIGS. 5–6, a conventional electronic device assembly includes a thermal module 1, a CPU 2, a socket 3, a PCB 4, a back plate 5, and a plurality of bolts 6 and nuts 7. The thermal module 1 is attached to the CPU 2, the CPU 2 is connected with the socket 3, and the socket 3 is mounted on the PCB 4. The back plate 5 is attached to an underside of the PCB 4, to reduce deformation of the PCB 4. The bolts 6 are respectively extended through the thermal module 1, the PCB 4 and the back plate 5, and respectively threadedly engaged with the nuts 7. The electronic device assembly is thus fixed together.

However, as shown in FIG. 7, the PCB 4 is still prone to be deformed in assembly. This adversely affects stability of the electronic device assembly.

SUMMARY OF THE INVENTION

Accordingly, an object of the present invention is to provide an electronic device assembly having a back plate that effectively prevents a PCB of the assembly from being deformed.

To achieve the above-mentioned object, an electronic device assembly includes a PCB, a socket mounted on the PCB, a CPU connected with the socket, a thermal module in thermal contact with the CPU, and a back plate attached to an underside of the PCB opposite the CPU. The back plate includes a pair of recessed portions, and a protruding portion between the recessed portions. The protruding portion is configured to abut against the PCB and thereby prevent deformation of the PCB. A plurality of bolts extends through the recessed portions of the back plate, the PCB and the thermal module, and respectively threadedly engages with a plurality of nuts. The electronic device assembly is thereby fixed together.

Other objects, advantages and novel features of the present invention will be drawn from the following detailed description of preferred embodiments of the present invention with attached drawings, in which:

DETAILED DESCRIPTION OF THE PREFERRED EMBODIMENTS

Figure 1:
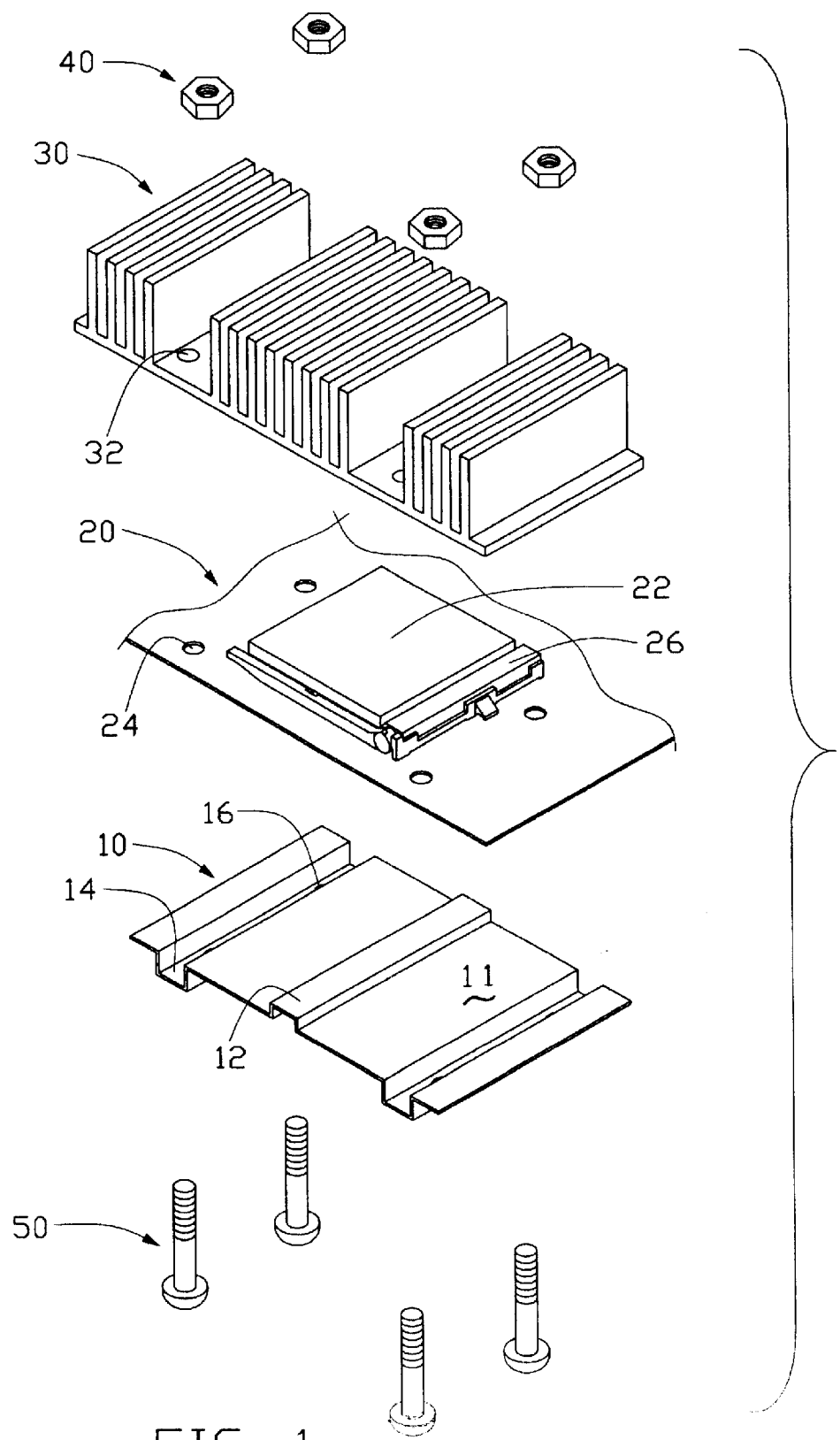
FIG. 1 is an exploded perspective view of an electronic device assembly in accordance with a preferred embodiment of the present invention.
Figure 3:
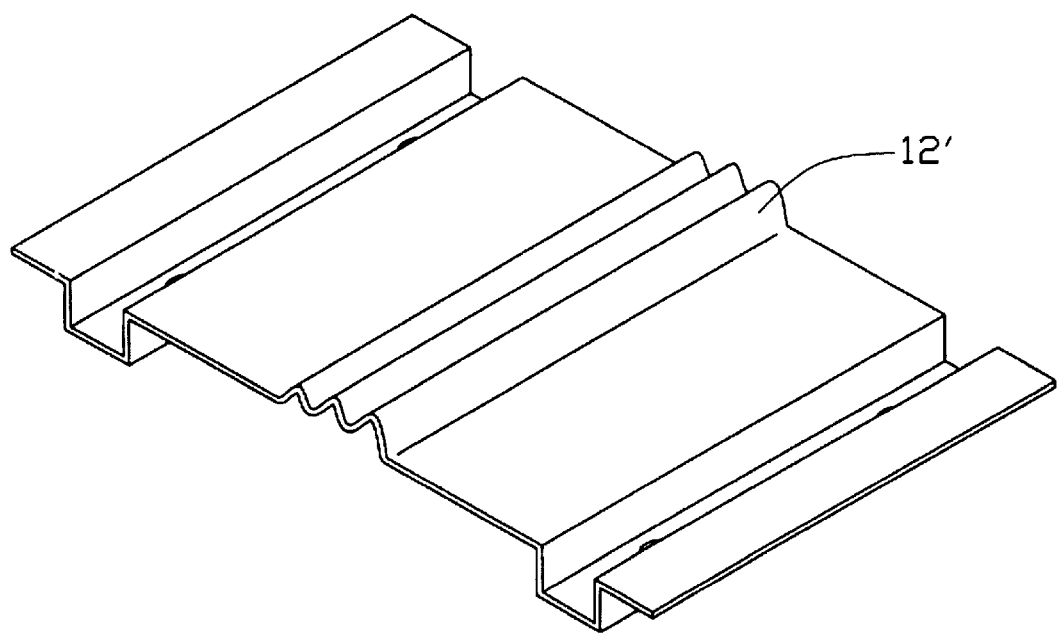
FIG. 3 is a perspective view of a back plate of an electronic device assembly in accordance with an alternative embodiment of the present invention.
Figure 4:
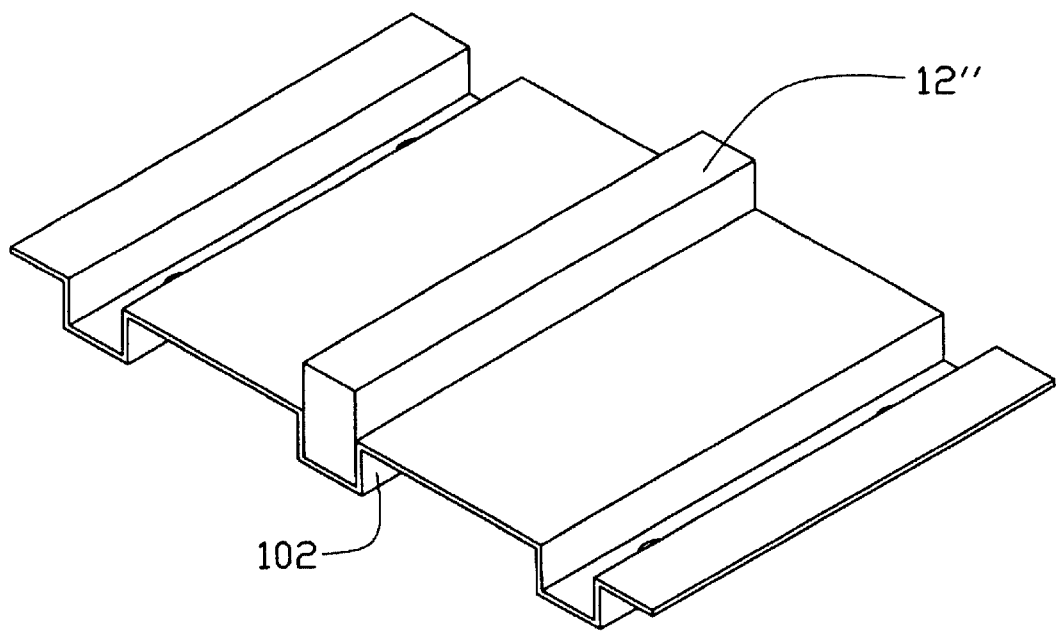
FIG. 4 is a perspective view of a back plate of an electronic device assembly in accordance with a further alternative embodiment of the present invention.
Figure 5:
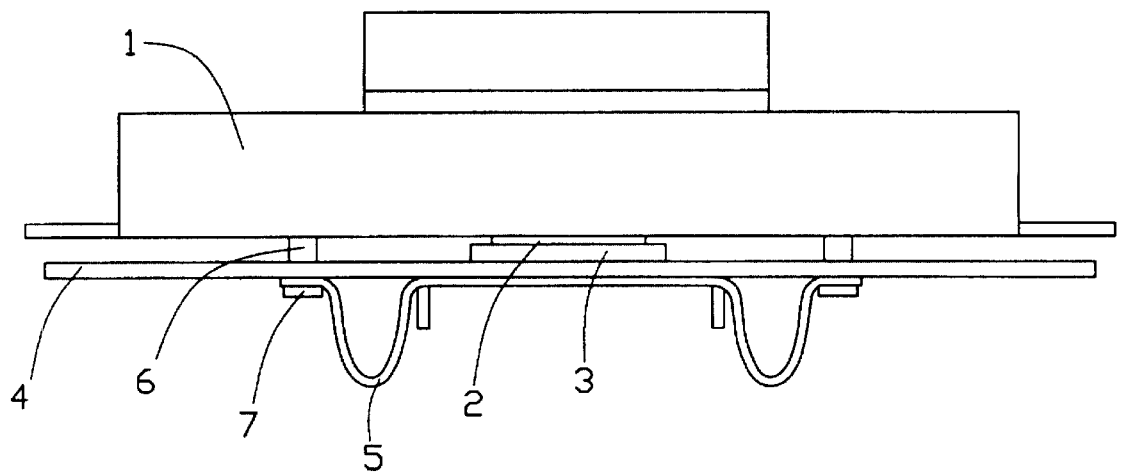
FIG. 5 is a schematic side plan view of a conventional electronic device assembly almost fully assembled.
Figure 6:
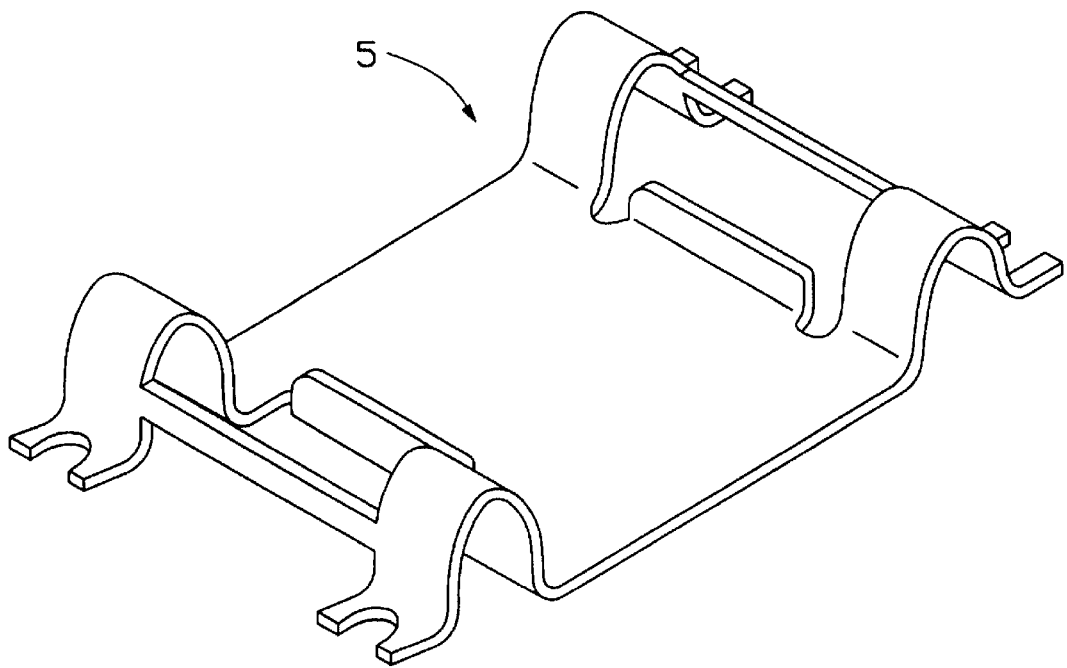
FIG. 6 is a perspective view of a back plate of the electronic device assembly of FIG. 5.
Figure 7:
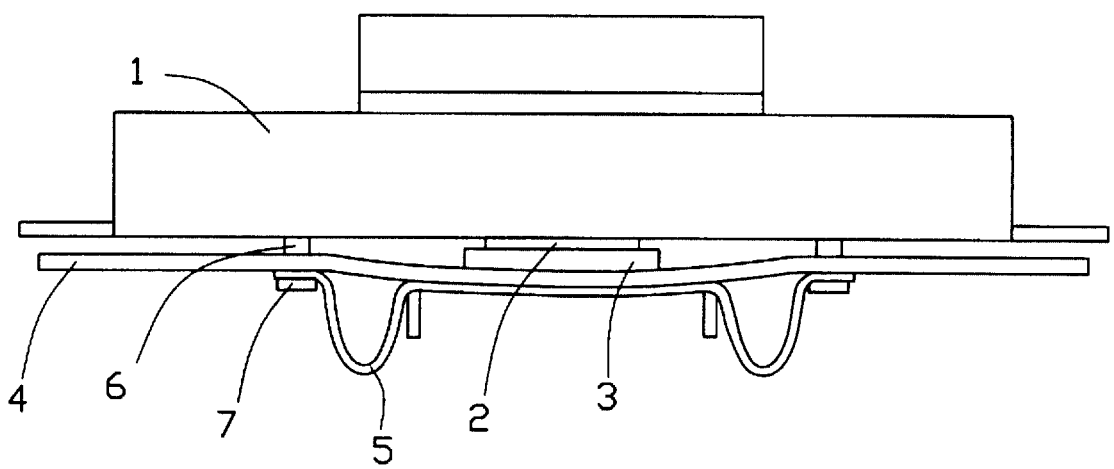
FIG. 7 is similar to FIG. 5, but showing the electronic device assembly fully assembled.

Referring to FIG. 1, an electronic device assembly in accordance with the present invention includes a back plate 10 with a base plane 11 thereon, a PCB 20, a socket 26 mounted on the PCB 20, a CPU 22 and a thermal module 30. A pair of parallel U-shaped recessed portions 14 is stampingly formed proximate respective opposite ends of the back plate 10. A pair of spaced securing holes 16 is defined in a bottom of each recessed portion 14. A protruding portion is upwardly stamped from a middle of the back plate 10, parallel to and between the recessed portions 14. In a preferred embodiment of the present invention, the protruding portion is an inverted U-shaped wall 12. As shown in FIG. 3, in an alternative embodiment of the present invention, the protruding portion is a plurality of inverted V-shaped ribs 12'. As shown in FIG. 4, in a further alternative embodiment of the present invention, the protruding portion comprises a block 12" received in a U-shaped recessed wall 102 stampingly formed in the back plate 10. For brevity, the following description refers only to the inverted U-shaped wall 12. The following description is, however, equally applicable to the inverted V-shaped ribs 12' and the block 12", with due alteration of details.

Referring back to FIG. 1, the PCB 20 defines two pairs of through holes 24, at opposite sides of the socket 26 respectively. The thermal module 30 defines two pairs of fixing holes 32 therein, corresponding to the through holes 24. Four bolts 50 and four nuts 40 also correspond to the through holes 24.

Figure 2:
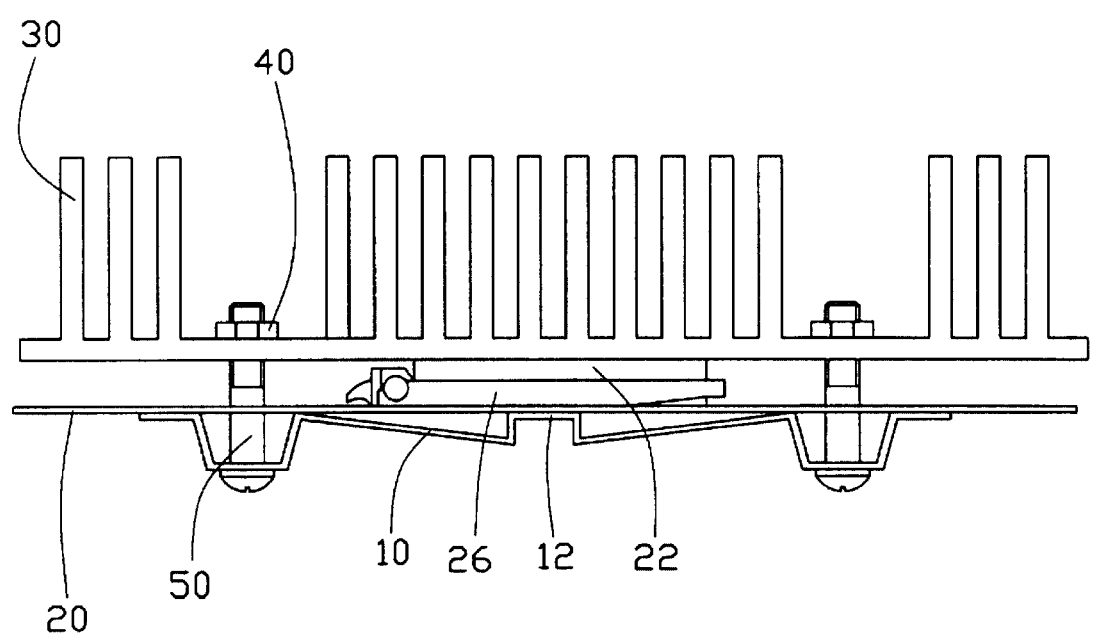
FIG. 2 is a side plan view of the electronic device assembly of FIG. 1 fully assembled.

Also referring to FIG. 2, in assembly, the CPU 22 is connected on the socket 26. The thermal module 30 is attached on the CPU 22. The back plate 10 is attached to an underside of the PCB 20 opposite the CPU 22, with the inverted U-shaped wall 12 of the back plate 10 abutting against the PCB 20. The bolts 50 are respectively extended through the securing holes 16 of the back plate 10, the through holes 24 of the PCB 20 and the fixing holes 32 of the thermal module 30, and respectively threadedly engaged with the nuts 40. The thermal module 30, the CPU 22, the socket 26, the PCB 20 and the back plate 10 are thus fixed together. The inverted U-shaped wall 12 resiliently abuts against the underside of the PCB 20 at a position generally below a center of the socket 26, the CPU 22 and the thermal module 30, thereby preventing deformation of the PCB 20.

It is understood that the invention may be embodied in other forms without departing from the spirit thereof. Thus, the present examples and embodiments are to be considered in all respects as illustrative and not restrictive, and the invention is not to be limited to the details given herein.

What is claimed is:

1. An electronic device assembly comprising:
   a printed circuit board;
   an electronic device mounted on the printed circuit board;
   a thermal module in thermal contact with the electronic device;

a back plate attached to an underside of the printed circuit board opposite the electronic device, the back plate comprising a base plane, two recessed portions extending below said base plane, and a protruding portion extending above said base plane, the protruding portion abutting against the underside of the printed circuit board thereby preventing deformation of the printed circuit board; and a plurality of fastening devices extending through the recessed portions of the back plate, the printed circuit board and the thermal module and fixedly connecting the back plate, the printed circuit board, the electronic device and the thermal module together.

2. The electronic device assembly as claimed in claim 1, wherein the fastening devices comprise a plurality of bolts extending through the back plate, the printed circuit board and the thermal module, and a plurality of nuts respectively threadedly engaging with the bolts, thereby fixing the electronic device assembly together.

3. The electronic device assembly as claimed in claim 1, wherein the protruding portion resiliently abuts against the printed circuit board, for preventing deformation of the printed circuit board.

4. The electronic device assembly as claimed in claim 3, wherein the protruding portion is a substantially inverted U-shaped wall.

5. The electronic device assembly as claimed in claim 3, wherein the protruding portion is a plurality of substantially inverted V-shaped ribs.

6. The electronic device assembly as claimed in claim 3, wherein the protruding portion comprises a block received in a substantially U-shaped recessed wall formed in the back plate.

7. The electronic device assembly as claimed in claim 1, wherein a socket is mounted on the printed circuit board, and the electronic device is connected on the socket.

8. An electronic device assembly comprising:

a printed circuit board;

a socket mounted on the printed circuit board;

an electronic device connected with the socket;

a thermal module in thermal contact with the electronic device;

a back plate attached to an underside of the printed circuit board opposite the electronic device, the back plate comprising a base plane, two recessed portions extending below said base plane, and a protruding portion extending above said base plane, the protruding portion abutting against the underside of the printed circuit board thereby preventing deformation of the printed circuit board; and a plurality of fastening devices extending through the recessed portions of the back plate, the printed circuit board and the thermal module and fixedly connecting the back plate, the printed circuit board, the electronic device and the thermal module together.

9. The electronic device assembly as claimed in claim 8, wherein the fastening devices comprise a plurality of bolts extending through the back plate, the printed circuit board and the thermal module, and a plurality of nuts respectively threadedly engaging with the bolts, thereby fixing the electronic device assembly together.

10. The electronic device assembly as claimed in claim 8, wherein the protruding portion is a substantially inverted U-shaped wall.

11. The electronic device assembly as claimed in claim 8, wherein the protruding portion is a plurality of substantially inverted V-shaped ribs.

12. The electronic device assembly as claimed in claim 8, wherein the protruding portion comprises a block received in a substantially U-shaped recessed wall formed in the back plate.

13. An electronic device assembly comprising:

a printed circuit board;

an electronic device assembly mounted on the printed circuit board;

a thermal module positioned above the printed circuit board and in contact with the electronic device assembly;

a back plate positioned on an underside of the printed circuit board opposite to said electronic device assembly, said back plate defining a base plane and a protrusion portion extending above said base plane and under the electronic device assembly;

at least one fastening device securing the back plate, the printed circuit board and the thermal module together; wherein the base plane around said fastening device abuts against the underside of the printed circuit board in a properly tensioned manner and maintains general planeness of the printed circuit board around said fastening device, and the protrusion portion abuts against the underside of the printed circuit board in a reinforced tensioned manner under a condition that the protrusion portion is downwardly deflected to be generally flush with said base plane located around the fastening device.

14. The assembly as claimed in claim 13, wherein said back plate further includes a recessed portion in which the fastening device is located.

15. An electronic device assembly comprising:

a printed circuit board;

an electronic device assembly mounted on the printed circuit board;

a thermal module positioned above the printed circuit board and in contact with the electronic device assembly;

a back plate positioned on an underside of the printed circuit board opposite to said electronic device assembly, said back plate defining an upward protrusion portion engaged with the underside of the printed circuit board essentially under the electronic device assembly, and a downward recessed portion located away from said protrusion portion;

a fastening device located in and engaged with said recessed portion, extending through said printed circuit board and retained to said terminal module under a condition that the protrusion portion is downwardly deflected to generate an enhanced force against the underside of the printed circuit board while still maintaining planeness of the printed circuit board around said recessed portion.

16. The assembly as claimed in claim 15, wherein other than direct engagement between the protrusion portion and the underside of the printed circuit board, said back plate directly engages the underside of said printed circuit board around said recessed portion.

17. An electronic device assembly comprising:

a printed circuit board;

an electronic device mounted on the printed circuit board;

a thermal module in thermal contact with the electronic device;

a back plate attached to an underside of the printed circuit board opposite the electronic device, the back plate comprising two recessed portions and a protruding portion between the two recessed portions, the protruding portion abutting against the underside of the printed circuit board thereby preventing deformation of the printed circuit board; and a plurality of fastening devices extending through the recessed portions of the back plate, the printed circuit board and the thermal module and fixedly connecting the back plate, the printed circuit board, the electronic device and the thermal module together; wherein the protruding portion resiliently abuts against the printed circuit board, for preventing deformation of the printed circuit board; wherein the protruding portion is a plurality of substantially inverted V-shaped ribs.

18. An electronic device assembly comprising:

a printed circuit board;

an electronic device mounted on the printed circuit board;

a thermal module in thermal contact with the electronic device;

a back plate attached to an underside of the printed circuit board opposite the electronic device, the back plate comprising two recessed portions and a protruding portion between the two recessed portions, the protruding portion abutting against the underside of the printed circuit board thereby preventing deformation of the printed circuit board; and a plurality of fastening devices extending through the recessed portions of the back plate, the printed circuit board and the thermal module and fixedly connecting the back plate, the printed circuit board, the electronic device and the thermal module together; wherein the protruding portion resiliently abuts against the printed circuit board, for preventing deformation of the printed circuit board; wherein the protruding portion comprises a block received in a substantially U-shaped recessed wall formed in the back plate.

* * * * *